(12) United States Patent
Perdoor et al.

(10) Patent No.: US 7,088,273 B1
(45) Date of Patent: Aug. 8, 2006

(54) REDUCING NOISE IN SWITCHED CAPACITOR AMPLIFIER CIRCUIT

(75) Inventors: Sandeep Mallya Perdoor, Bangalore (IN); Visvesvaraya A. Pentakota, Bangalore (IN); Ravishankar S. Ayyagari, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/160,855

(22) Filed: Jul. 13, 2005

(30) Foreign Application Priority Data

May 30, 2005 (IN) .......................... 653/CHE/2005

(51) Int. Cl.
 *H03M 1/10* (2006.01)
(52) U.S. Cl. ....................................... 341/120; 341/172
(58) Field of Classification Search ................ 341/120, 341/172, 155, 161
 See application file for complete search history.

(56) References Cited

U.S. PATENT DOCUMENTS

| | | | | |
|---|---|---|---|---|
| 6,396,429 B1 * | 5/2002 | Singer et al. | ................ | 341/155 |
| 6,515,611 B1 * | 2/2003 | Fetterman et al. | .......... | 341/161 |
| 6,545,628 B1 * | 4/2003 | Aram | .......................... | 341/155 |
| 6,891,486 B1 * | 5/2005 | Pentakota et al. | .......... | 341/120 |
| 6,909,391 B1 * | 6/2005 | Rossi | ......................... | 341/161 |
| 6,963,300 B1 * | 11/2005 | Lee | .............................. | 341/172 |
| 7,009,549 B1 * | 3/2006 | Corsi | .......................... | 341/161 |

* cited by examiner

*Primary Examiner*—Linh Nguyen
(74) *Attorney, Agent, or Firm*—W. James Brady, III; Frederick J. Telecky, Jr.

(57) ABSTRACT

A switched capacitor environment in which a feedback capacitor of a stage is flipped to be used as a sampling capacitor of the next stage. Due to such use of the feedback capacitor, the noise introduced by the stages is substantially reduced. Such switched capacitors can be used in analog to digital converters (ADC).

17 Claims, 16 Drawing Sheets

REDUCING NOISE IN SWITCHED CAPACITOR AMPLIFIER CIRCUIT

RELATED APPLICATION(S)

The present application is related to and claims priority from the co-pending India Patent Application entitled, "Reducing Noise in Switched Capacitor Amplifier Circuit", Serial Number: 653/CHE/2005, Filed: May 30, 2005, naming the same inventors as in the subject patent application, and is incorporated in its entirety herewith.

FIELD OF THE INVENTION

The present invention relates to integrated circuit design, and more specifically to a method and apparatus for reducing noise in a switched capacitor amplifier circuit

RELATED ART

Amplifier circuits (amplifiers) are often employed to amplify signals. In general, an amplifier amplifies an external input signal and provides the amplified signal as an output signal. A switched capacitor amplifier is a type of amplifier circuit, which contains operational amplifier(s) (op-amp), switches and capacitors driven by clock signals. The switches are operated to control the connections and attain the desired amplification, as is well known in the relevant arts.

Switched capacitor amplifiers are used in various environments, and analog to digital converter (ADC) represents an example apparatus in which switched capacitor amplifiers are implemented, as described below with reference to FIG. 1. FIG. 1 is a block diagram of an example prior pipeline ADC used to illustrate the problems caused by a prior switched capacitor amplifier circuit. ADC 100 is shown containing sample and hold amplifier (SHA) 110, stages 120-1 through 120-S and digital error correction block 130. Each block is described below in further detail.

SHA 110 samples input signal received on path 134 and holds the voltage level of the sample for further processing. Each stage 120-1 through 120-S generates a sub-code corresponding to a voltage level of an analog signal received as an input, and an amplified residue signal as an input to a (any) next stage. Digital error correction block 130 receives sub-codes from various stages, and generates a digital code (on path 146) corresponding to the sample received on path 134.

FIG. 2 further illustrates the logical operation of each stage (described with reference to stage 120-1 only, for conciseness) according to a prior approach. Stage 120-1 is shown containing flash ADC 250, digital to analog converter (DAC) 260, subtractor 270 and gain amplifier 280. Flash ADC 250 (an example of a sub ADC) converts a sample of an analog signal received on path 111 into a corresponding P-bit sub-code provided on path 256. DAC 260 converts the sub-code received on path 256 into corresponding analog signal (Vdac) on path 267.

Subtractor 270 generates a residue signal as the difference of sample 111 (Vi) and the analog signal received on path 267 (Vdac). Gain amplifier 280 amplifies the residue signal (Vi−Vdac), which is provided on path 112 as an amplified residue signal. The signal on path 112 is used to resolve the remaining bits in the N-bit digital code by the subsequent ADC stages. Subtractor 270, DAC 260, and gain amplifier 280 can be implemented using a capacitor network and an operational amplifier together operating as a switched capacitor amplifier as described below with respect to FIG. 3A.

FIG. 3A is a circuit diagram depicting the details of a portion of stages 120-1 and 120-2 according to a prior approach. The circuit diagram is shown containing op-amps 355 and 375, capacitors 321–324, 331–334, 371–373 and 381–383, and switches 311–315, 341–345, 361–365, and 391–395. The operation of the components is described below in further detail.

The circuit in FIG. 3A operates in two phases according to a clock signal. Stage 350 operates to sample the signals received on inputs 310 and 340 in phase one, and amplify and hold the sampled signal in phase two. On the other hand, stage 370 operates to sample the signal received from stage 350 in phase two, and amplify and hold the amplified signal at the output in phase one. The desired operations in the two phases are obtained by operating various switches, as described below with reference to FIGS. 3B and 3C respectively.

FIG. 3B is a circuit diagram depicting the operation of phase 1 in which switches 311, 313, 314, 341, 343, 344, 362, 365, 392 and 395 are closed (making contact) and switches 312, 315, 342, 345, 361, 363, 364, 391, 393, and 394 are open. For clarity and conciseness, the portions of the circuit not connected due to the open switches and not necessary for an understanding of the circuit operation, are not shown.

Capacitors 321 and 331 are charged to store a charge proportionate to the differential input signal received on path 310 and 340 (due to the closing of switches 311 and 341). Capacitors 323 and 333 discharges the charges accumulated (e.g., from a previous phase operation) due to closing of switches 313, 314, 343, and 344. Capacitors 371, 373, 381, 383 of stage 370 operate similar to the operations of 321, 331,323, 333 in phase 2 of the operation, as described below with reference to FIG. 3C.

FIG. 3C is a circuit diagram depicting operation of phase 2 (of the circuit diagram of FIG. 3A) in which switches 312, 315, 342, 345, 361, 363, 364, 391, 393 and 394 are closed (making contact) and switches 311, 313, 314, 341, 343, 344, 362, 365, 392 and 395 are open. One of the terminals of capacitors 321 and 331 gets connected to the reference input REFP and REFM respectively due to operation of switches 312 and 342.

It should be understood that switches 312/342 are closed when a subtraction operation (described above with respect to FIG. 2 above) is to be performed, and kept open otherwise. When the switches are kept open, the configuration operates to amplify the input signal (without subtracting the reference signal REFM REFP). When not connected to the reference signal, the corresponding terminals of capacitors 321 and 331 need to be connected to common mode (or ground) by operation of appropriate switches (not shown).

Capacitors 321 and 331 discharge (pump) a charge proportionate to difference of sampled voltage and reference voltage into capacitors 323 and 333 respectively. Due to the operation of switches 315 and 345, voltage developed across capacitors 323 and 333 appears at the output terminals 360 and 390 respectively. A difference of capacitance values of feed back capacitor and sampling capacitor causes amplification of the difference signal (from the principle Q=CV).

Capacitors 371 and 381 sample the output of the first stage on path 360 and 390 respectively, and store a charge proportional to the voltage on the terminal 323B and 333 B of the capacitors 323 and 333 respectively due to the operation of the switches 361 and 391. Capacitors 373 and 383 discharges accumulated charges (from the previous phase).

However each stage 350 and 370 of switched capacitor amplifier described above contributes/adds noise to the signal being amplified. The amount of noise contributed by each stage depends, among other factors, on noise generated by the stage itself and amplification of noise received from the previous stage.

Typically, the noise generated by a switched capacitor amplifier connected to a capacitance load of $C_L$ (effective capacitive load offered by the following stages) is given by corresponding input referred noise power (value effectively measured at the input of the stage 350) ($N_{p1}$) as:

$$N_{PI} = \frac{4}{3} \times (1+\alpha) \times \frac{KT}{C_L} \times \frac{1}{\beta} \times \frac{1}{G^2} \quad \text{Equation (1)}$$

wherein β represents a feedback factor of op-amp (equals to a ratio of capacitance value of feedback capacitor to sum of the capacitance values of all the capacitor connected to input terminals of the op-amp), α represents a ratio of trans-conductance of all noise contributing transistors in the circuit (not shown in the figures) to trans-conductance of input transistors, G represents a loop gain of the amplifier (equal to a ratio of the capacitance values of feedback capacitor to sampling capacitor), K represents a Boltzmann constant and T represents ambient temperature, as is well known in the relevant arts.

Accordingly, noise power at the output of the op-amp 355 may be correlated to G2 times the input referred noise power $N_{p1}$. As a result, the effective noise power input by a stage to the following stage is proportionate to $N_{p1}$*G2 wherein * represents a multiplication operation.

Such noise contribution may introduce bit error in the sub-codes, which in turn may lead to errors in the final bits of the ADC. It is desirable that accumulation of noise be minimized to reduce bit errors in the ADC. There is a general need to provide switched capacitor amplifiers, which reduces contribution of noise (e.g., of the type described above).

BRIEF DESCRIPTION OF THE DRAWINGS

The present invention will be described with reference to the accompanying drawings, which are described below briefly.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

The present invention allows implementation of multistage switched capacitor amplifier while reducing the noise contribution of each stage. The reduction in noise is achieved by using a feed back capacitor of a stage as a sampling capacitor of the immediately following next stage. As a result, the effective noise input to the immediately following next stage is reduced. Further, due to sharing of the capacitor, noise introduced by individual components in each stage is reduced.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Circuit

Figure 4A:
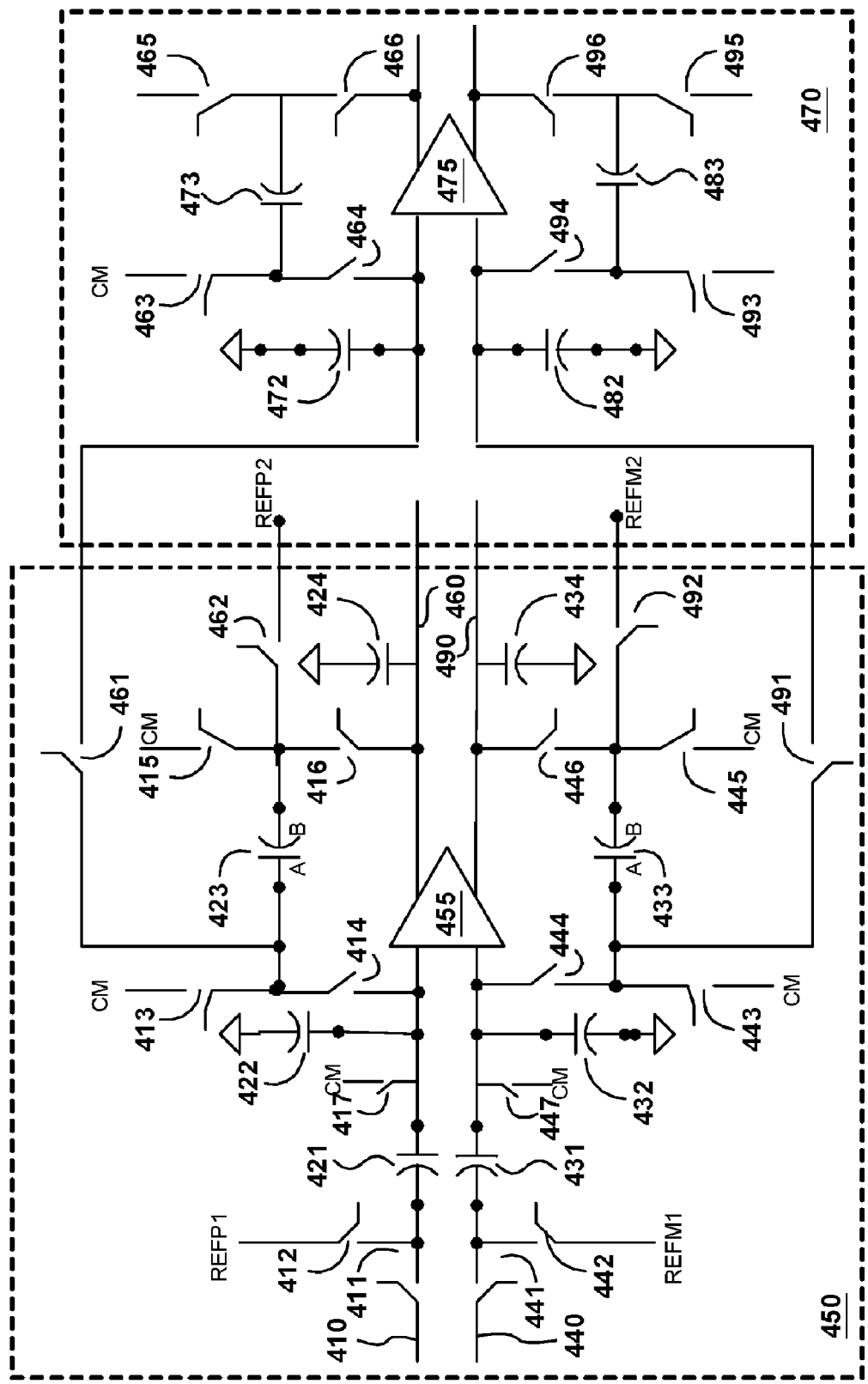
FIG. 4A is a circuit diagram of an example circuit illustrating various aspect of present invention.

FIG. 4A is a circuit diagram of an example circuit illustrating various aspect of present invention. The circuit is shown containing two switched capacitor amplifier stages 450 and 470. Stage 450 is shown containing op-amp 455, capacitors 421–424 and 432–434, and switches 411–417 and 441–447. Stage 470 is shown containing op-amp 475, capacitors 472, 473, 482 and 483 and switches 461–466 and 491–496. The operation of the components is described below in further detail According to an aspect of present invention, capacitors 423 and 433 operate as feed back capacitors of first stage 450 in one phase of the clock cycle, and are flipped to operate as a sampling capacitor of next stage in another phase of the clock cycle. Capacitors 423 and 433 are discharged before being connected back to the first stage to operate as feedback capacitor for the following iteration. The broad operation of the circuit of FIG. 4A is described first with the timing diagram of FIG. 5, and then the circuit is described in further detail.

Figure 5:
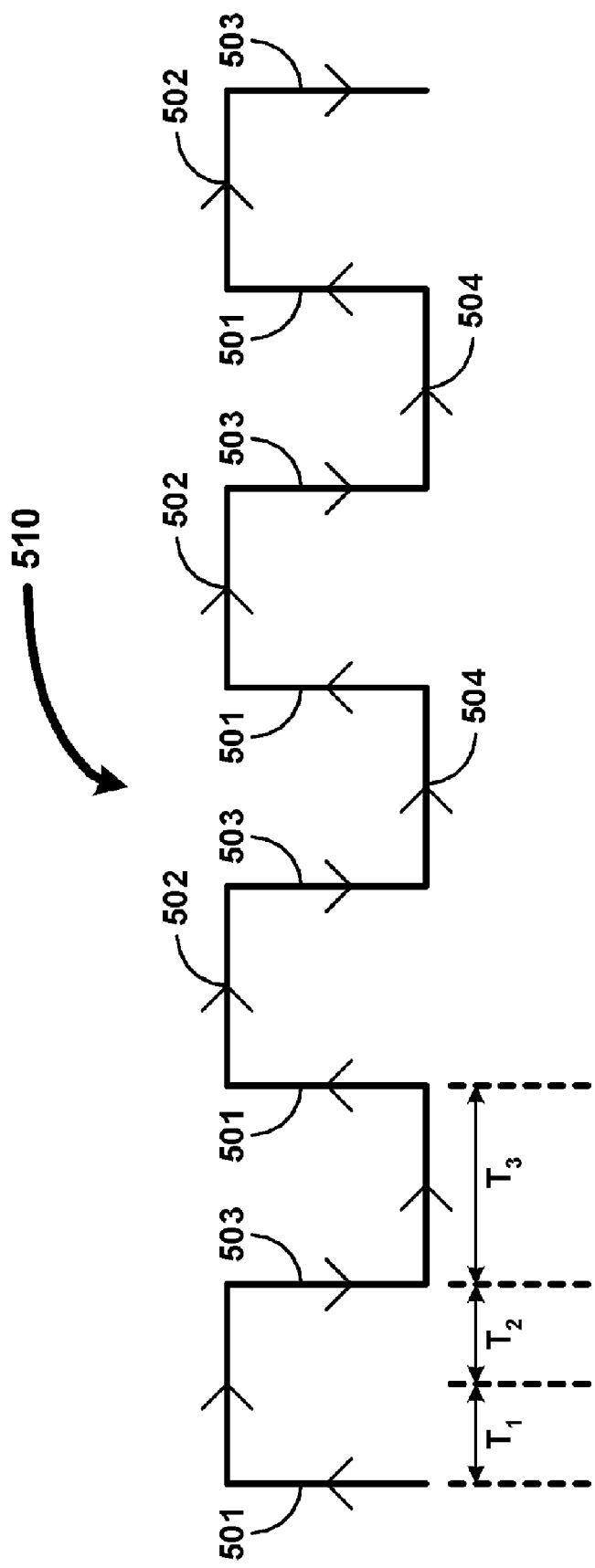
FIG. 5 is a timing diagram providing time reference for the three phases of operation of FIGS. 4B, 4C and 4D.

FIG. 5 is a timing diagram illustrating timing reference corresponding to operation of capacitors and switches in FIG. 4A. The timing diagram is shown containing clock signal 510 having rising edges 501, falling edges 503, level1 502 and level2 504. The time durations of level1 502 and level2 504 respectively correspond to phase 1 and phase 2 of the clock signal. Phase 1 operations may be initiated at the time instant corresponding to rising edge 501 and phase 2 operations may be initiated at the falling edge 503.

Continuing with combined reference to FIGS. 4A and 5, during phase 1, sampling capacitors 421 and 431 operate to sample the differential input signal on paths 410 and 440. However, capacitors 423 and 433 operate as sampling capacitors of the second stage during T1 (causing substantial part of the charge to be redistributed/pumped to capacitors 473 and 483 respectively), and discharges any residue charge during T2 shown in FIG. 5 to support phase 2 operation at the subsequent falling edge 503.

In phase 2 (level 504), sampling capacitors 421 and 431 are connected to reference signal and capacitors 423 and 433 operate as feedback capacitors of the first stage, and support amplification and hold operation of the first stage 450. The description is continued for phase 2 of the clock signal with an initial condition representing capacitors 421 and 431 having a charge proportionate to the input signal sampled during phase 1 of the clock signal.

Figure 1:
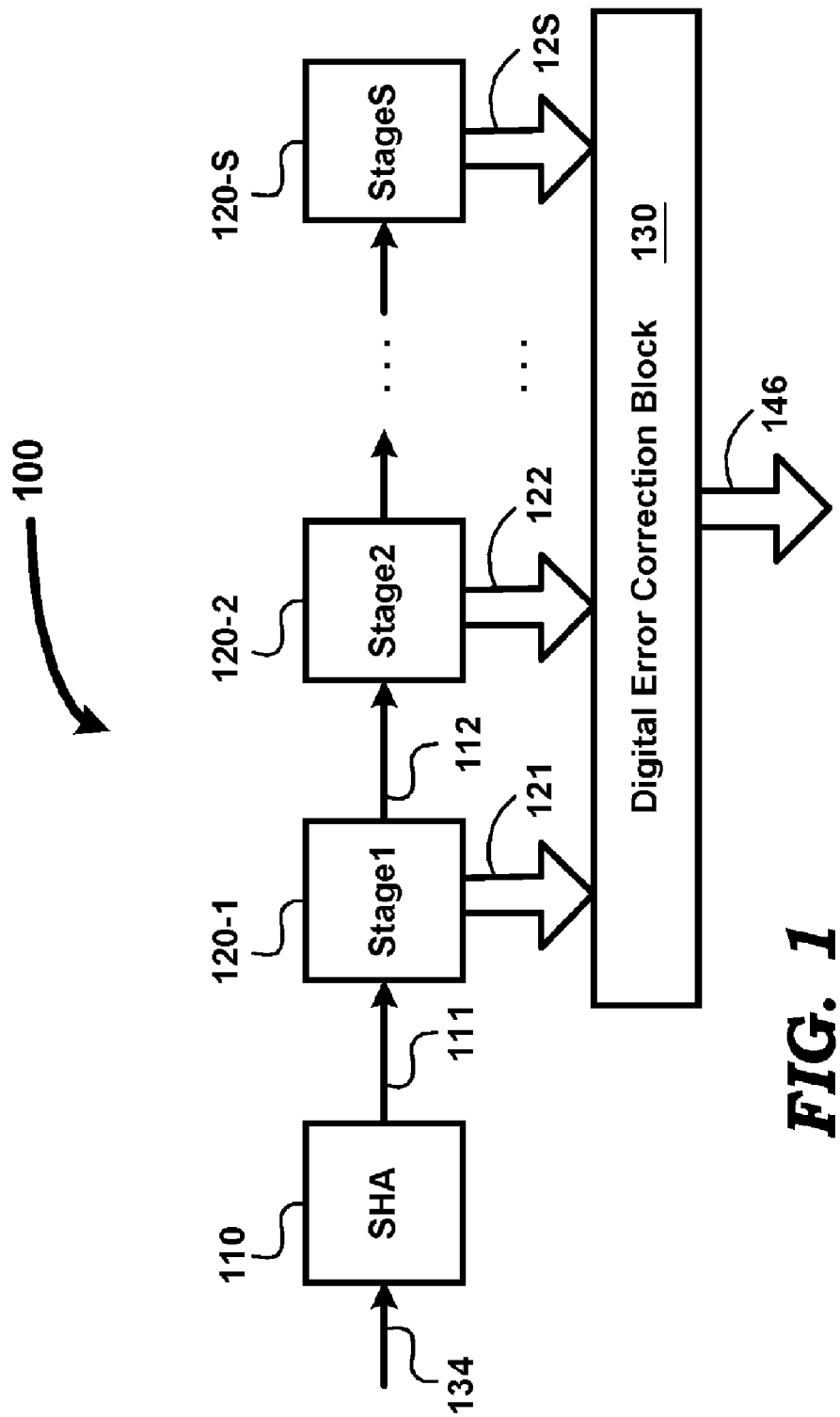
FIG. 1 is a block diagram of an example prior pipeline ADC used to illustrate some example problems solved by various aspects of the present invention.
Figure 2:
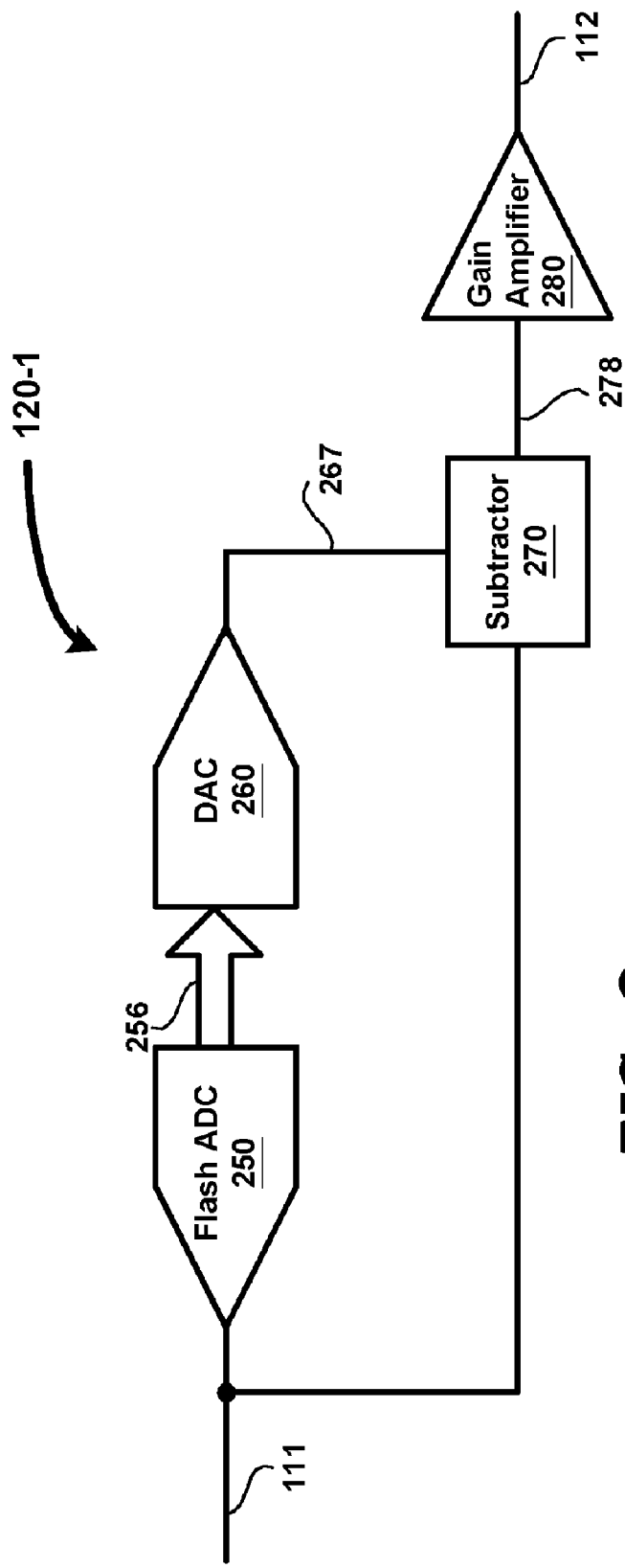
FIG. 2 is a block diagram illustrating the logical operation of each stage of a pipeline ADC according to a prior approach.
Figure 3A:
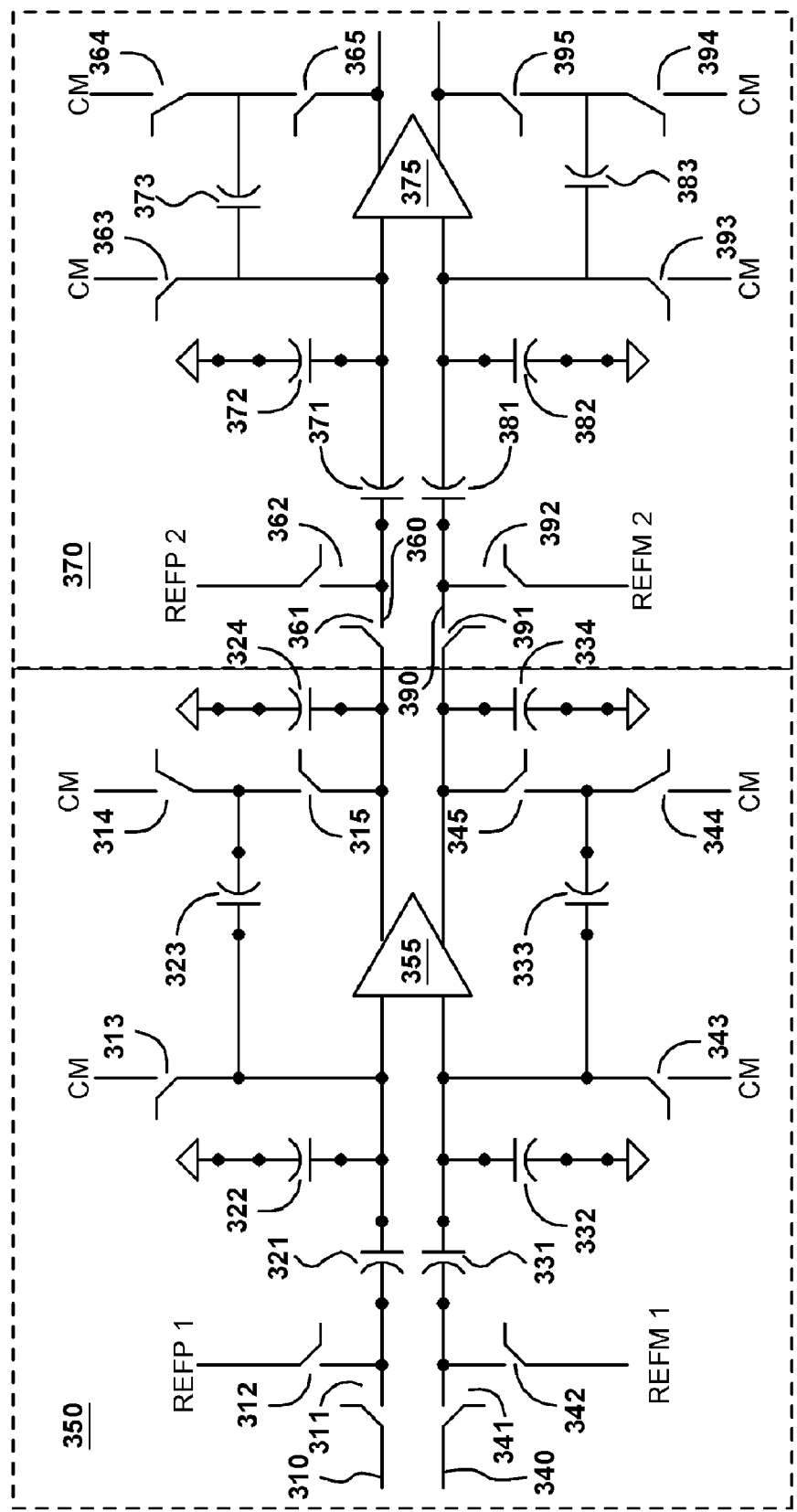
FIG. 3A is a circuit diagram depicting the details of a portion of a stage of an ADC according to a prior approach.
Figure 3B:
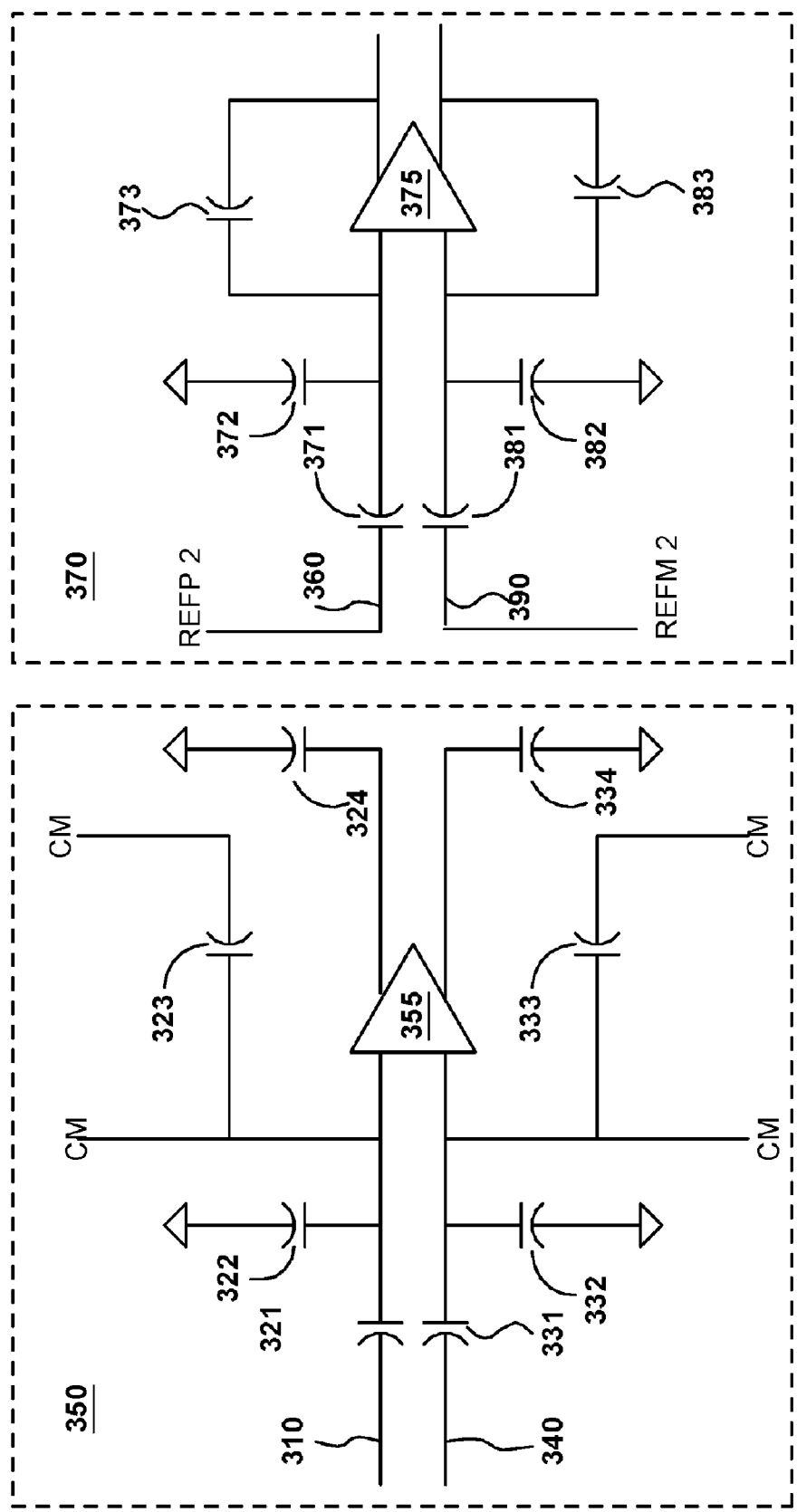
FIGS. 3B and 3C are circuit diagrams illustrating the operation of the stage of FIG. 3A in different phases.
Figure 3C:
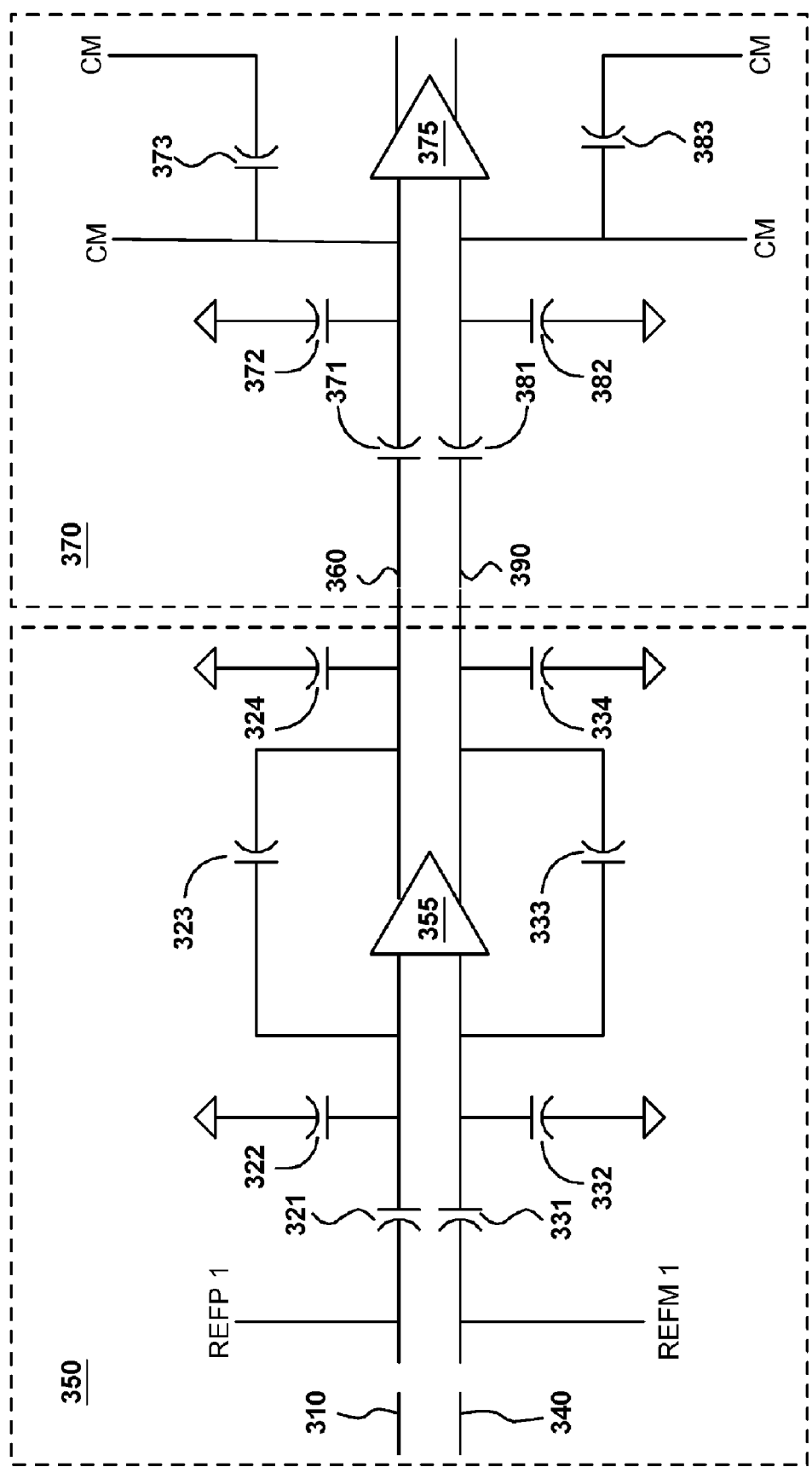
Figure 4B:
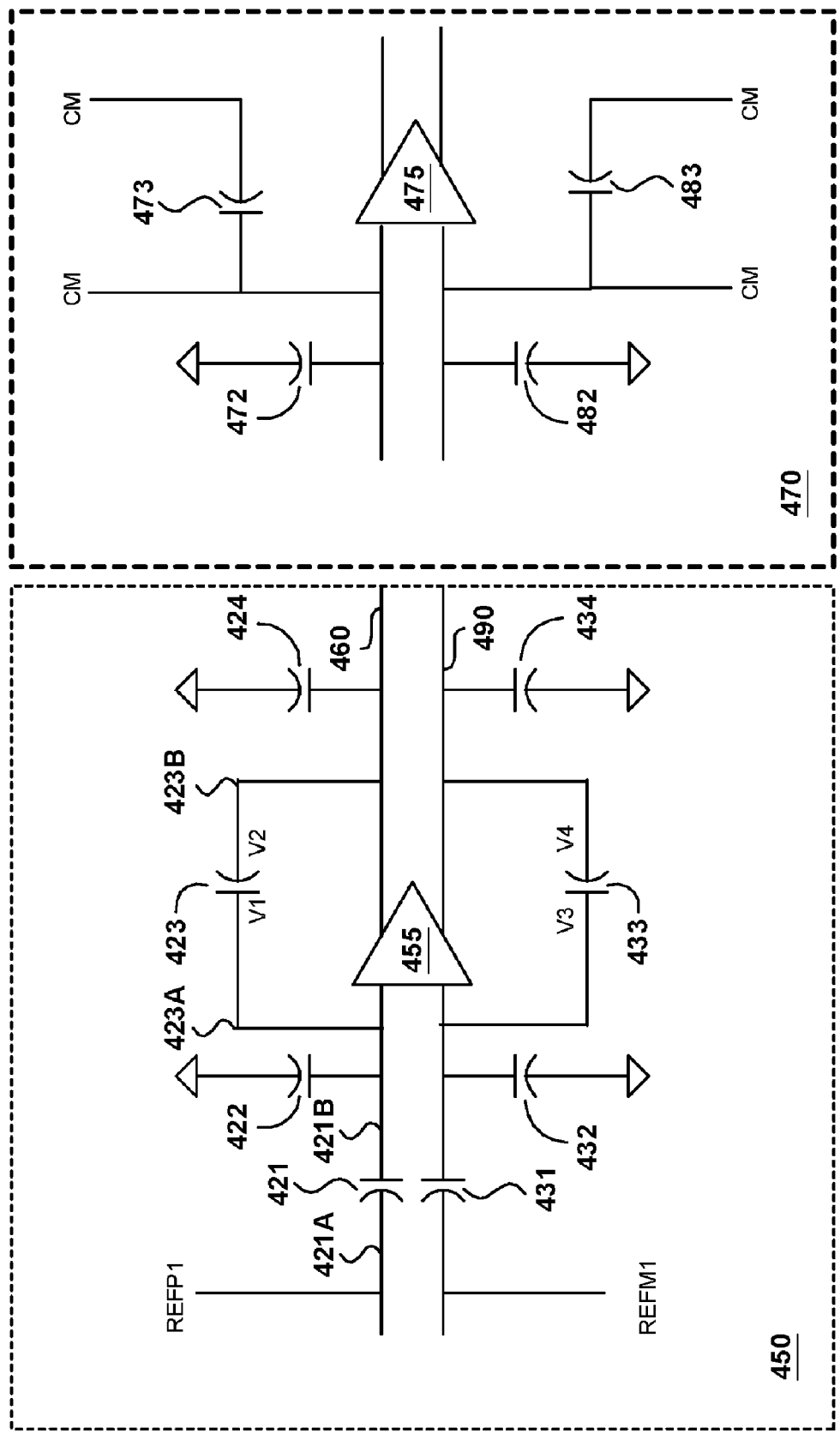
FIGS. 4B, 4C and 4D are circuit diagrams illustrating the operation of the circuit of FIG. 4A in corresponding three phases in an embodiment of the present invention.

FIG. 4B is a circuit diagram illustrating various switches positions corresponding to the operation of the circuit of FIG. 4A in phase 2. The circuit is shown with switches 412, 414, 416, 442, 444, 446, 463, 464, 465, 493, 494 and 495 closed, and remaining switches open. Capacitors 421, 431, 423 and 433 respectively operate similar to operation of capacitors 321, 331, 323, 333 in FIG. 3C described above, and detailed description is not provided in the interest of conciseness.

In phase 2, switches 412 and 442 connect capacitors 421 and 431 to the reference signals REFP and REFM respectively. As a result, charge proportionate to the difference of sampled input signal and reference signals is transferred to capacitors 423 and 433. Correspondingly, a voltage proportionate to the charge received from the sampling capacitors 421 and 431 is developed across each feedback capacitor 423 and 433. The voltage developed across capacitors 423 and 433 are represented by potentials V1 and V3 on plate (terminal) 423A and 433A, and potentials V2 and V4 on plates 423B and 433B in FIG. 4B.

The differential output generated by the first stage corresponds to a value (V2−V1)−(V4−V3). However, due to potentials V1 and V3 being maintained at the same value (typically at a common mode reference) by op-amp 455, the differential output corresponding to difference input signal will be equal to a value V2−V4. Accordingly, potentials V2 and V4 together represent amplified differential output signal of the first stage 450. Similarly, from the description given with respect to equation 1, a noise proportionate to $N_{p1}*G2$ is presented along with the output signal by first stage 450.

From the above description, it is apparent that during phase 2 operation, the capacitors 423 and 433 attain a charge and terminal voltages similar to a capacitor sampling the output of the first stage. Since capacitors 423 and 433 are used as sampling capacitors of second stage, the sampling operation corresponding to second stage is performed in phase 2 of the clock signal.

The manner in which effective noise input to the following stage is reduced due to the flipping of the feedback capacitor 423/433 in FIG. 4A, is described below with respect to the operation of phase 1 during the time period T1.

Figure 4C:
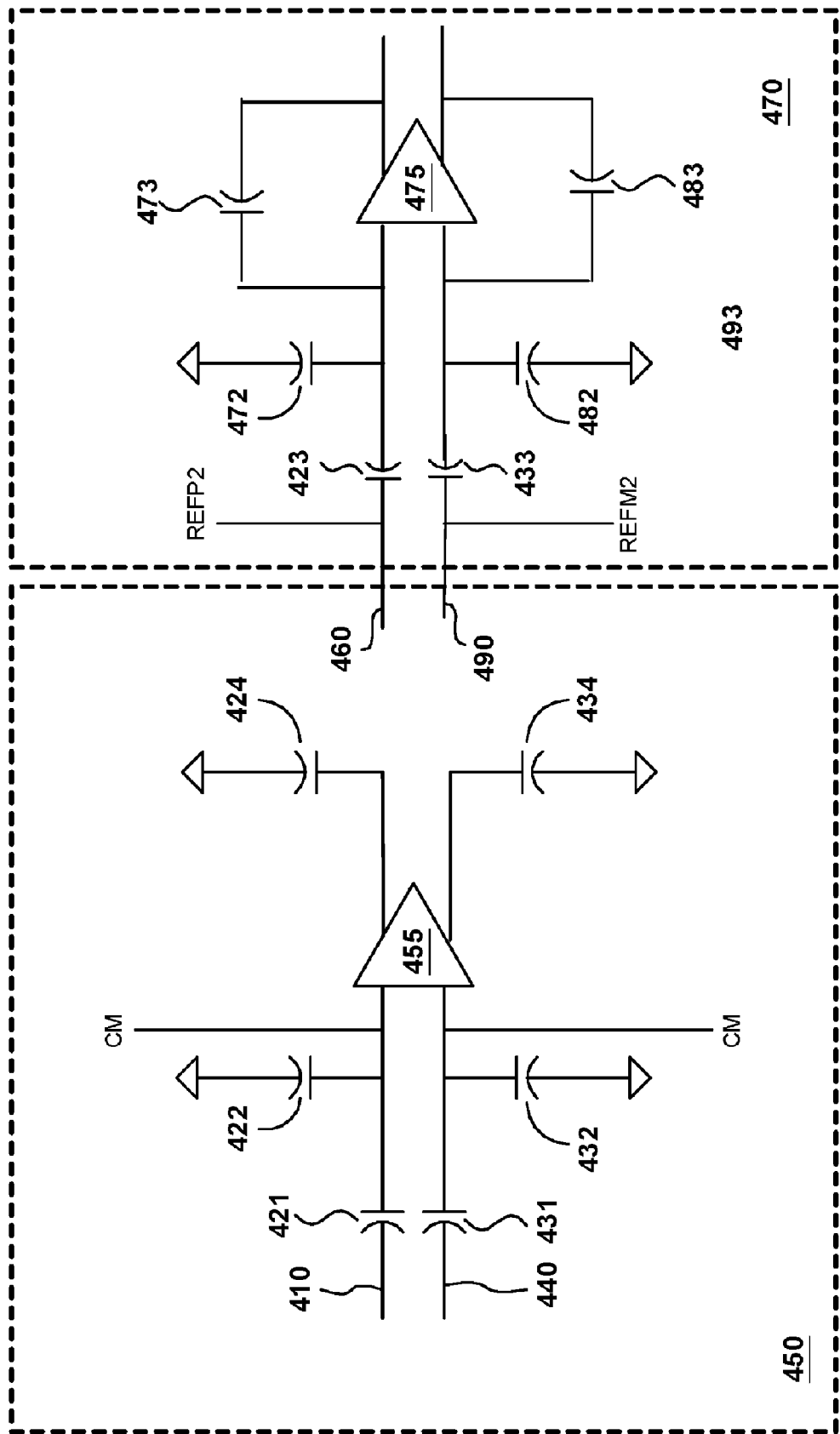

FIG. 4C is a circuit diagram depicting the position of various switches in time period T1, thereby illustrating the operation of circuit 4A in phase 1. The circuit is shown with switches 411, 417, 441, 447, 461, 462, 464, 466, 491, 492, 494 and 496 closed and the remaining switches open. In phase 1, first stage 450 operates to sample the input signal as described below first.

In phase 1, switches 411 and 441 connect capacitors 421 and 431 to input path 410 and 440 respectively. Accordingly, capacitors 421 and 431 store a charge proportionate to the input signal strength (voltage). The charge stored is represented as a voltage across the capacitors. Since the other terminal of the capacitors are connected to op-amp 450 and tied to common mode reference, the sampled input voltage appears on the input terminals of capacitors 421 and 431. This sets an initial condition of capacitors 421 and 431 for the operation of the second phase (as assumed above in the description of FIG. 4B before describing the phase 2 operation). Description is continued with respect to second stage.

Switches 461 and 491 respectively connect terminals 423A and 433A of capacitor 423 and 433 to the second stage op-amp 475, and switches 462 and 492 respectively connect terminal 423B and 433B to the second stage reference REFP and REFM. The change of connections, causing the capacitors to change operation from feedback capacitors of stage 455 to sampling capacitors of the second stage 470, is referred to as flipping.

Since capacitor terminals 423B and 433B contained a potential V2 and V4 as described in phase 2, the difference of potentials (V2−REFP) and (V4−REFM) causes a charge proportionate to the difference to be pumped to capacitors 473 and 483 respectively.

Figure 4D:
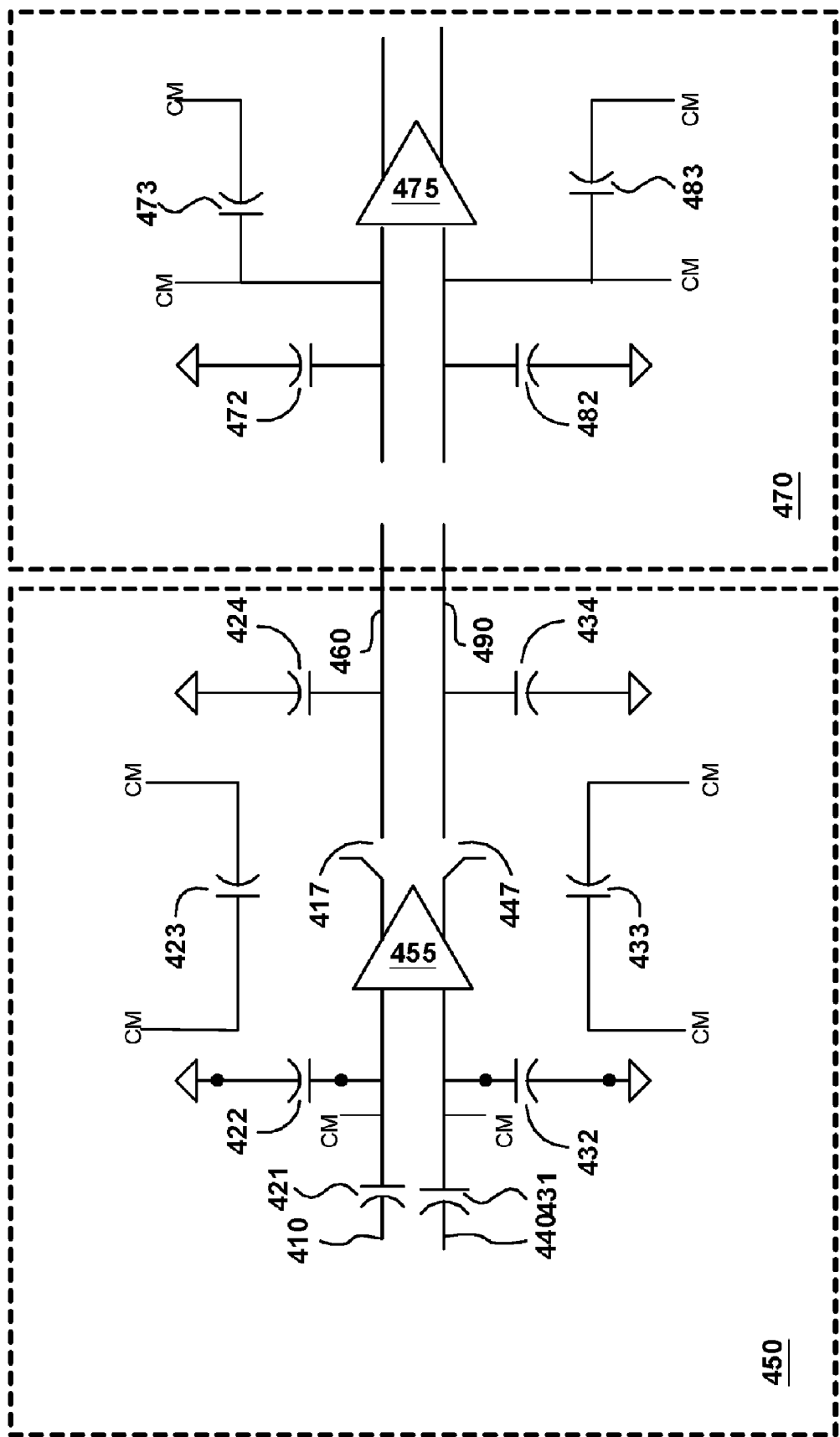

As a result, second stage 470 performs an amplification of difference signal and holds the amplified difference signal at the output of the second stage. Capacitors 423 and 433 are discharged during time period T2 to support the phase 2 operation again. The switch arrangements corresponding to time duration T2 are shown in FIG. 4D. Briefly, switches 413 and 415 connect the terminals of capacitor 423 to common mode reference, and switches 443 and 445 connect the terminals of capacitor 433 also to common mode reference, to discharge any residue charge on the two capacitors.

However, due to the flipping of capacitors 423 and 433 to the second stage and using the charges and potentials across the terminal of the capacitors for generating the amplified difference signal in second stage, the effective noise presented to the input of the second stage corresponds to (A-B), wherein A represents the voltage across terminals 423B and 433B, and B represents noise power across terminals 423A and 433A. Accordingly, the corresponding reduced noise power represented at the input of the stage is given as:

$$N_{PI} = \frac{4}{3} \times (1+\alpha) \times \frac{KT}{C_L} \times \frac{1}{\beta} \times \frac{1}{G^2} \times (1-\beta)^2 \qquad \text{Equation (2)}$$

From the above, it may be appreciated that the noise is reduced due to the use of the feedback capacitor of a stage as a sampling capacitor of an immediately following stage. The reduction of noise power becomes significant as feedback factor (β) reaches a value 1. Also the noise is further reduced due to reduction in number of capacitors, and various other noise contributing components supporting the capacitors. While the description above is provided with respect to differential operation, the approaches can be used in conjunction with single-ended operation as well.

The approaches described above can be implemented in several environments. In one embodiment described below, the approach is applied to an embodiment in which two stages of a switched capacitor amplifier are implemented using a single op-amp, as described below with respect to FIG. 6A.

3. Flipping Feedback Capacitor in Two Stages Using a Single Op-Amp

Figure 6A:
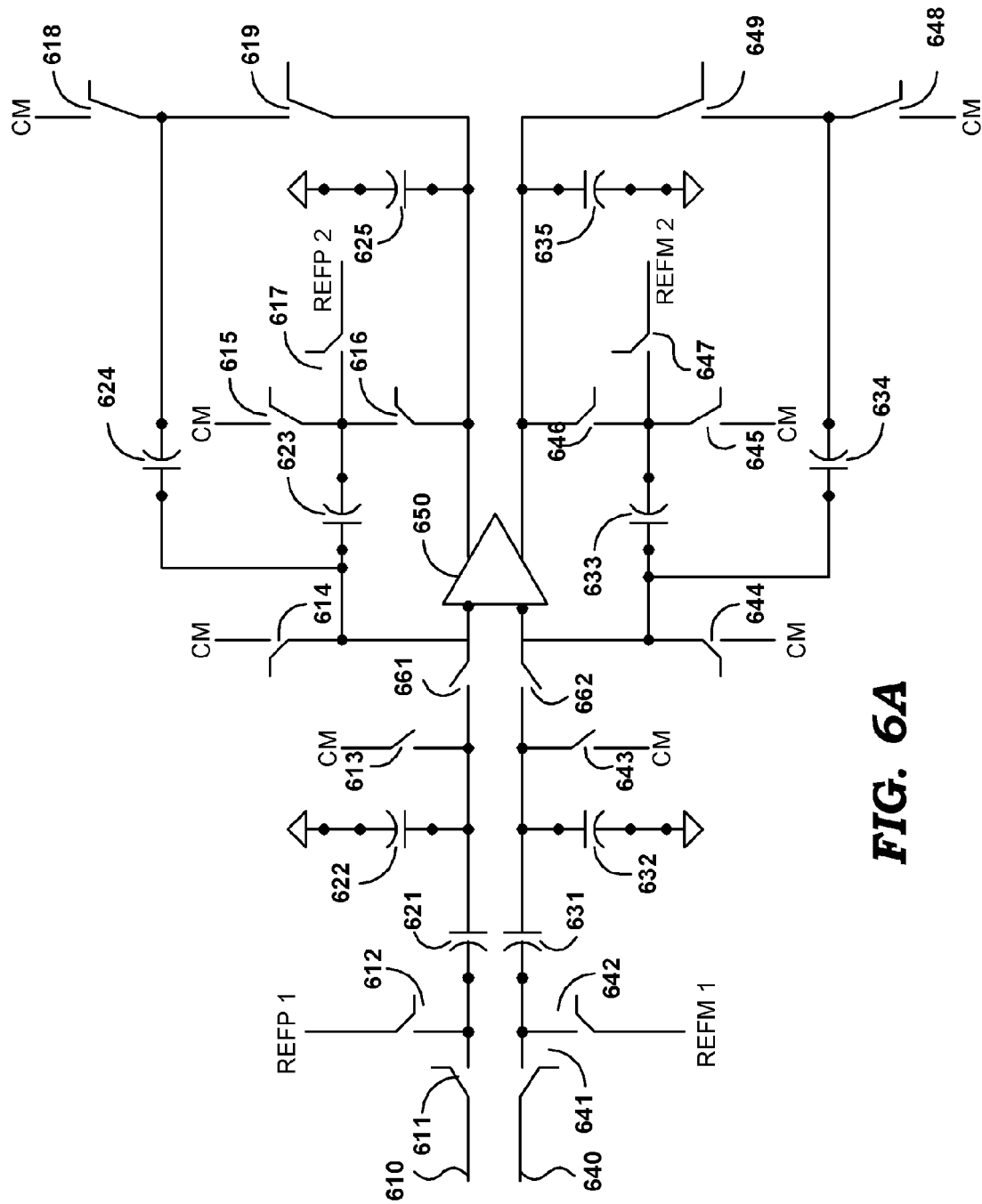
FIG. 6A is a circuit diagram illustrating the manner in which two stages are implemented while sharing a single op-amp in an embodiment of the present invention.

FIG. 6A is a circuit diagram illustrating the manner in which the implementation of two stages of a switched capacitor amplifier using a single op-amp according to an aspect of present invention. The circuit diagram is shown containing capacitors 621–625 and 631–635, switches 661, 662, 611–619 and 641–649 and op-amp 650. The operation of the circuit is described below in further detail.

Op-amp 650 along with capacitors 621, 631,623 and 633, references REFP1 and REFM2 operate together as a first stage of switched capacitor amplifier. Capacitors 623, 643, 624 and 644, references REFP2 and REFM2 operate together as a second stage of switched capacitor amplifier, with both stages using the same op-amp 650.

Operational amplifier 650 is operated in 3 phases of the clock signal. In phase 1, op-amp 650 is used to perform operations corresponding to second stage (475); in phase 2, op-amp 650 is not used and in phase 3 operational amplifier 650 is used to perform operations corresponding to first stage (455). Accordingly, FIG. 7 illustrates a timing reference for three phases of operation with respect to a reference clock signal.

Figure 7:
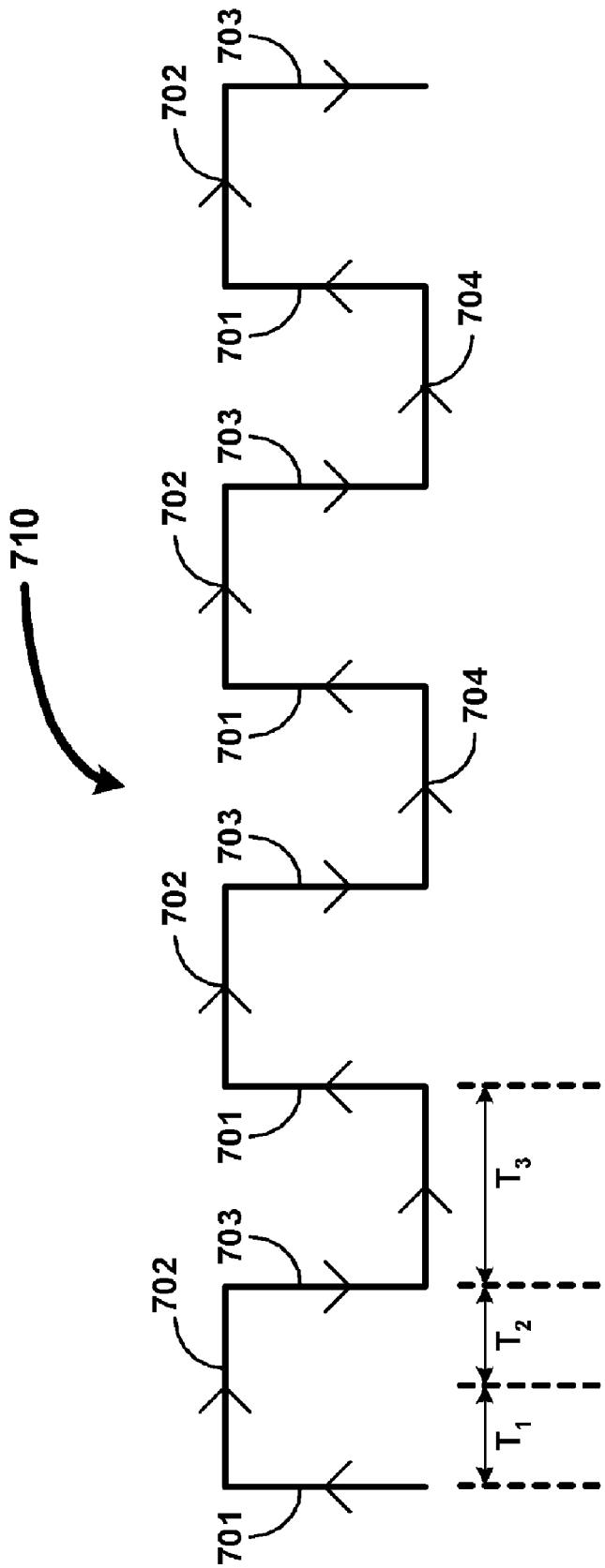
FIG. 7 is a timing diagram providing time reference for the three phases of operation of FIGS. 6B, 6C and 6D.

In FIG. 7, signal 750 represents a reference clock signal. Time durations T1, T2 and T3 respectively correspond to phase1, phase2 and phase3 operations of op-amp 650. The operation in each phase is described below in further detail.

Figure 6B:
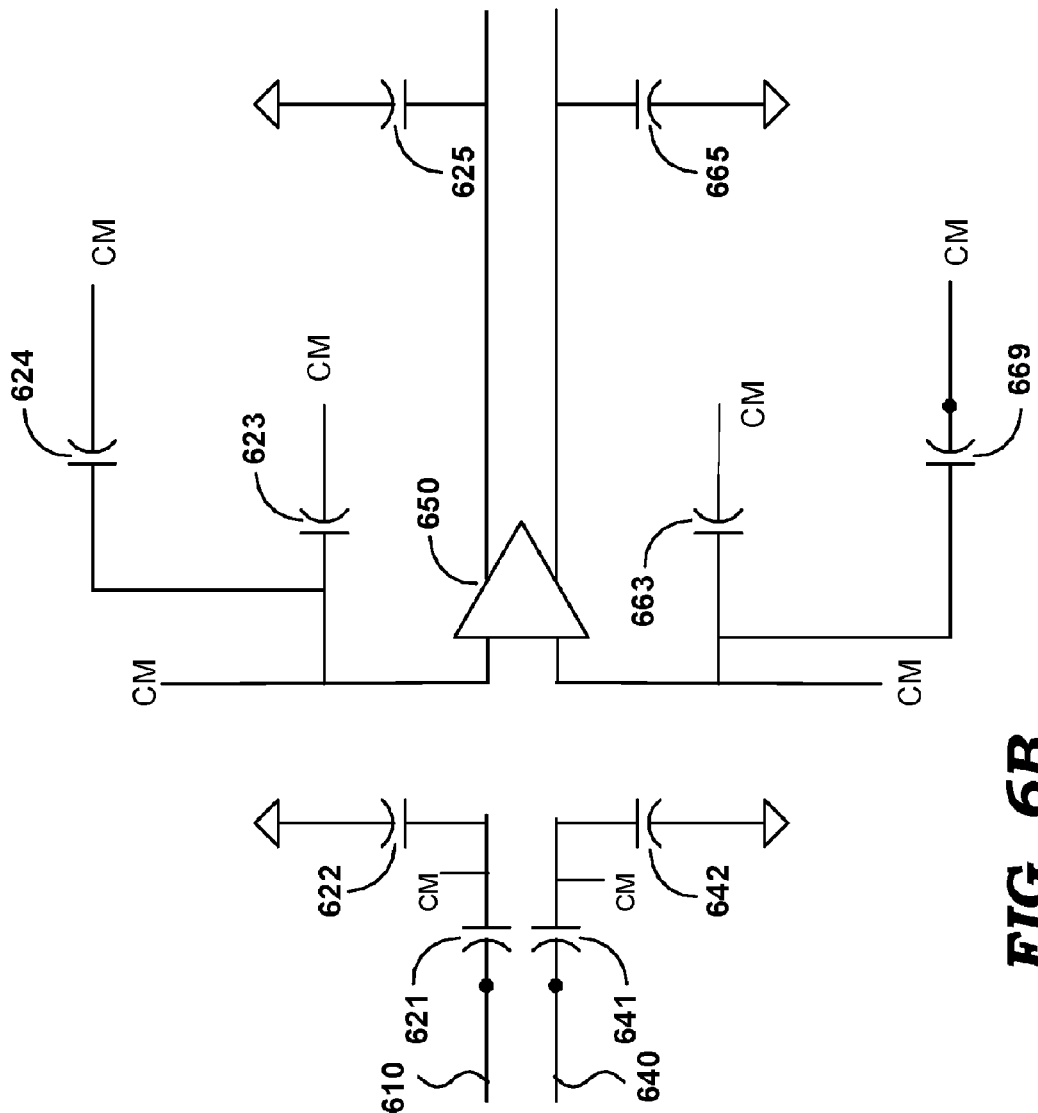
FIGS. 6B, 6C and 6D are circuit diagrams illustrating the operation of the circuit of FIG. 6A in corresponding phases in an embodiment of the present invention.

FIG. 6B is circuit diagram illustrating the operation of the circuit of FIG. 6A in phase 2. The circuit diagram is shown with switches 611, 613–615, 618, 641, 643–645 and 648 closed and all other switches open. Accordingly, capacitors 621 and 631 operate similar to the capacitors 621 and 631 in FIG. 4C, and store a charge proportional to the input signal. Capacitor terminal represented by folded plate (shown as curve/bent) maintains a voltage proportional to the input signal.

Capacitors 623,624,633,634 discharge any charge accumulated during the previous phases of operation. The discharging of the capacitor is performed by connecting both terminals of capacitors to a common mode reference (assumed to be same for both stages) as described in FIG. 4D. The detail circuit is not shown again for conciseness.

Figure 6C:
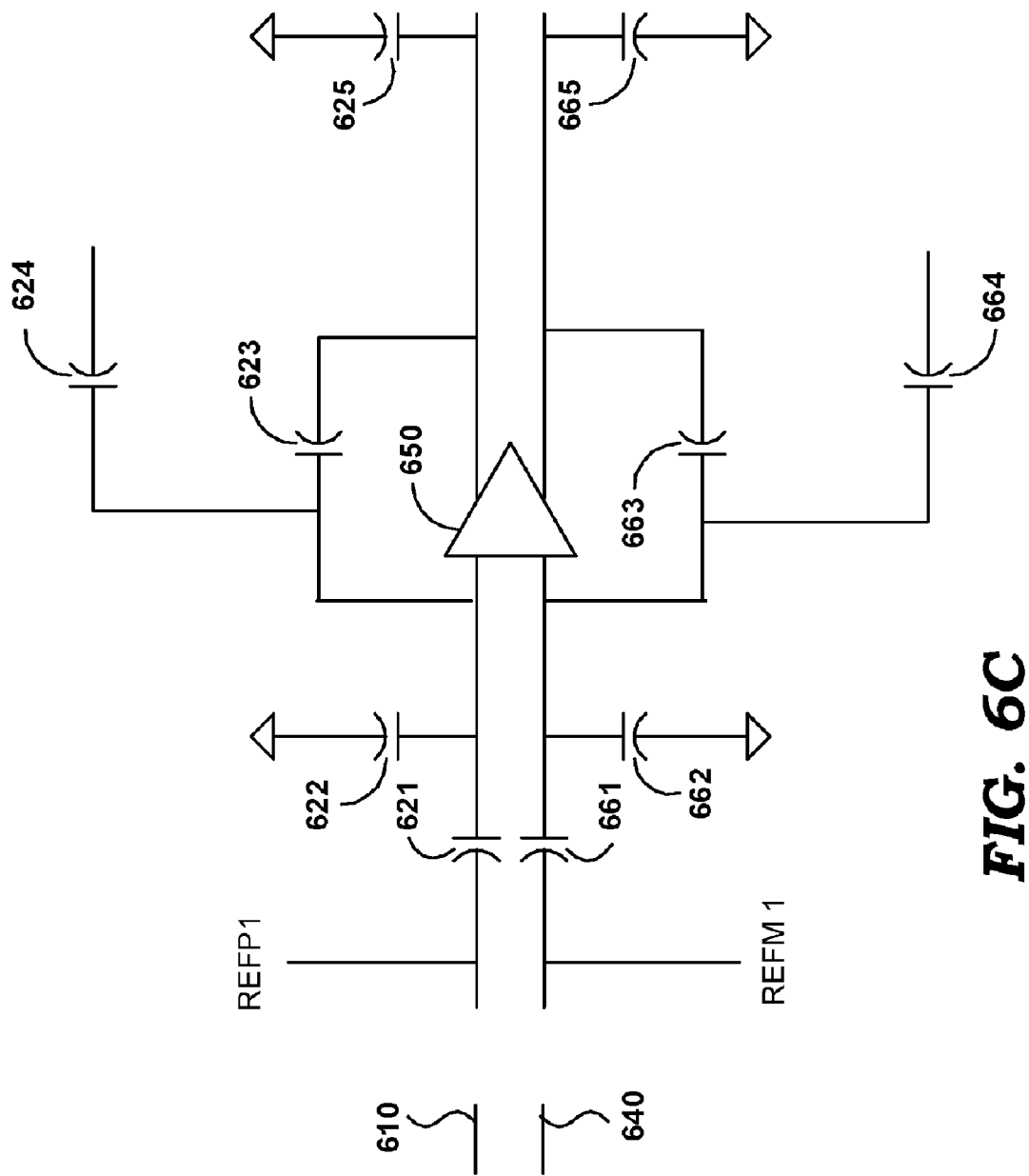

FIG. 6C is a circuit diagram representing of the circuit of FIG. 6A in phase 3. The circuit corresponds to a configuration in which switches 612, 642, 661, 662, 616 and 646 are closed and all other switches are open. Accordingly the terminal (represented as folded plate) of capacitors 621 and 631, maintaining the sampled input signal are connected to (first stage reference) REFP1 and REFM1 respectively. As a result, a charge proportional to difference of the sampled input and first stage reference is pumped to capacitors 623 and 633 respectively.

The charge thus transferred to capacitors 623 and 633 causes a voltage proportionate to the pumped charge to appear at the output of op-amp 650. Based on the ratio of the capacitance value of sampling capacitors and feed back capacitors, the appeared voltage corresponds to an amplified difference value. The amplified difference value corresponds to the output of the first stage.

Thus, at the end of the first stage, each of capacitors 623 and 633 holds a charge proportional to the amplified difference, and terminals (shown with folded plate) of the capacitors holds a voltage value proportional to the output of the first stage (amplified difference value). Hence, the operation of phase 3 also represents a sampling phase of the second stage.

Figure 6D:
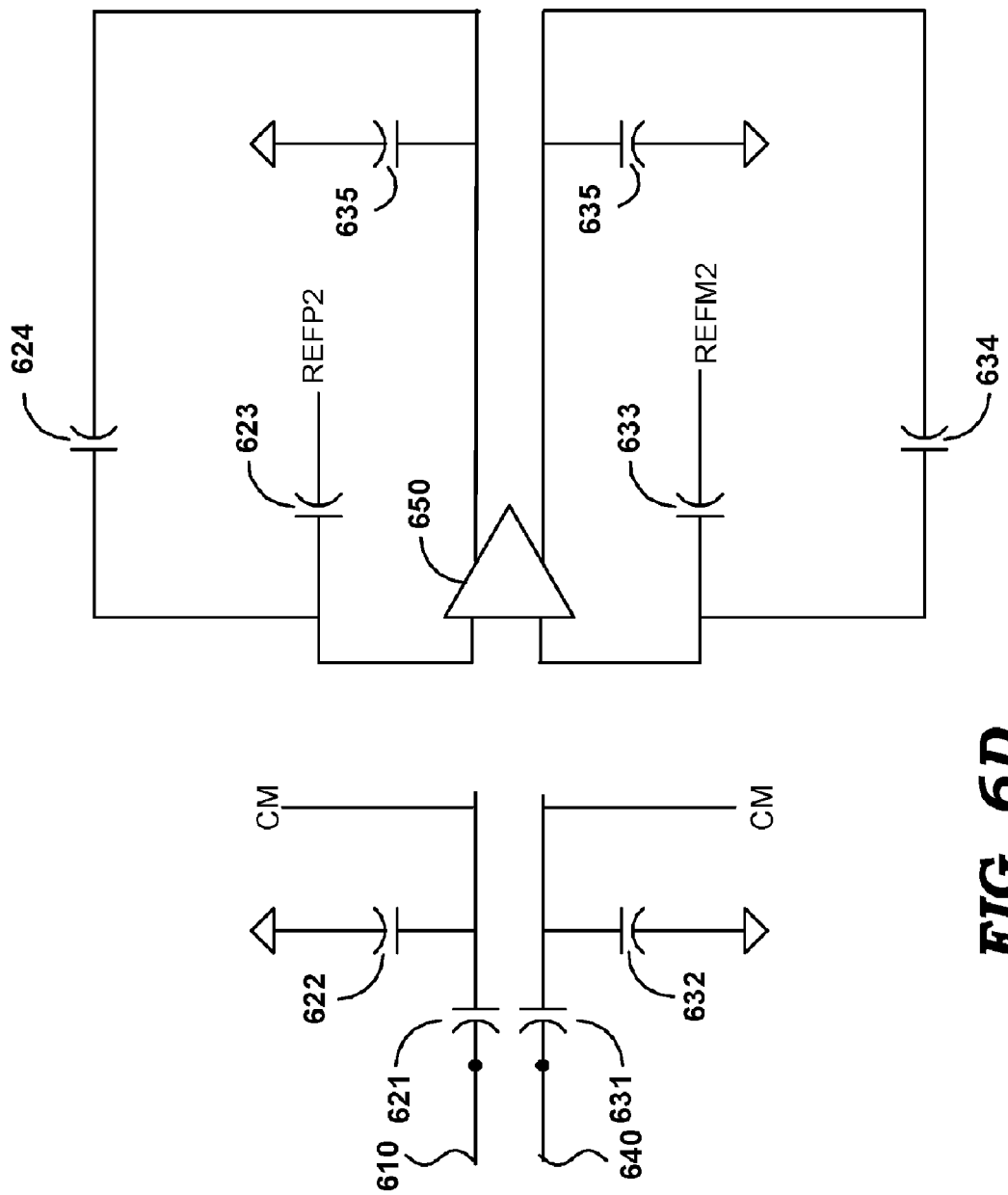

FIG. 6D is a circuit diagram illustrating the operation of the circuit of FIG. 6A in phase 1. The circuit corresponds to a configuration in which switches 611,613, 617, 619,641, 643,647 and 649 are closed and the remaining switches as open. Accordingly, capacitors 623 and 633 are connected to the second stage reference signal (REFP2 and REFM2) respectively. Consequently, a charge proportional to the difference of the amplified difference signal (due to the operation of phase 2) and the second stage reference is pumped to capacitors 624 and 634. As a result, the output of op-amp 650 represents an effective second stage output of FIG. 5B.

It should be understood that different combinations of switches can be used to achieve the same flipping result and other connections noted above, without departing from the scope and spirit of several aspects of the present invention, as will be apparent to one skilled in the relevant arts by reading the disclosure provided herein. It should also be understood that the multi-stage switched capacitor amplifier thus implemented, can be used in various devices/systems. An example device in which the switched capacitor amplifier can be implemented is described below in further detail.

4. Device

Figure 8:
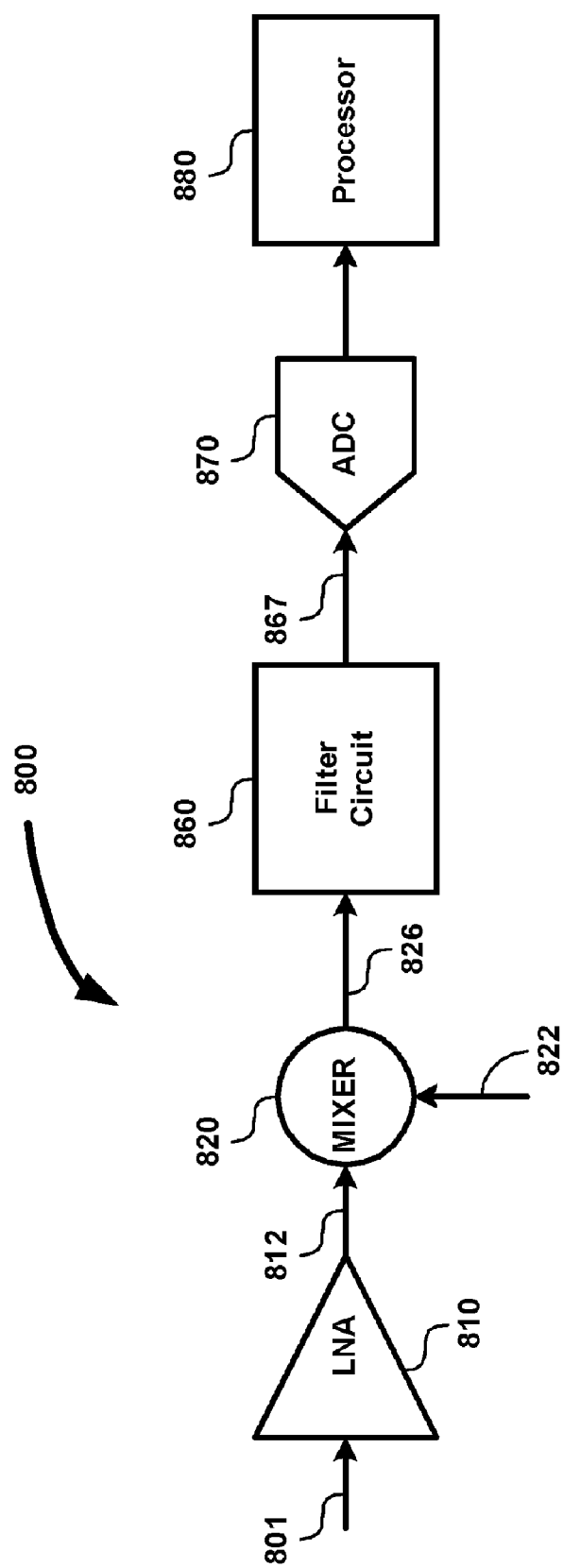
FIG. 8 is a block diagram of an example system in which various aspects of the present invention may be implemented.

FIG. 8 is a block diagram of receiver system 800 illustrating an example system in which various aspects of the present invention may be implemented. For illustration, it is assumed that receiver system 800 is implemented within a Wireless Receiver. However, receiver system 800 can be implemented in other devices (wireless as well as wire-based communications) as well.

Receiver system 800 is shown containing low noise amplifiers (LNA) 810, mixer 820, filter circuit 860, analog to digital converter (ADC) 870, and processor 880. Each block/stage is described in further detail below.

LNA 810 receives signals on path 801 and amplifies the received signals to generate a corresponding amplified signal on path 812. For example, in wireless systems, the signals that are transmitted from satellites, etc., may be received by an antenna (not shown) and the received signals are provided on path 801. The received signals may be weak in strength and thus amplified by LNA 810 for further processing. LNA 810 may be implemented in a known way.

Mixer 820 may be used to down-convert the received amplified signal on path 812 into an intermediate signal with the frequency band of interest centered at a lower frequency than the carrier frequency of the received signal. In an embodiment, a signal with the frequency band of interest centered at 2.4 GHz (carrier frequency) is converted to a signal with the frequency band of interest centered at zero frequency.

Mixer 820 may receive the amplified signal on path 812 and a signal of fixed frequency on path 822 as inputs, and provides the intermediate signal on path 826. The signal of fixed frequency on path 822 may be generated by a phase locked loop (not shown) in a known way.

Filter circuit 860 may correspond to a low pass filter, which allows the desired low frequencies and rejects all other unwanted high frequencies present in the signal received on line 826. The filtered signal, which contains the frequency band of interest, is provided on path 867.

ADC 870 converts (samples) the filtered signal received on path 867 to a corresponding digital value, which represents the signal of interest in received signal 801. Processor 880 processes the received digital values to provide various user applications and may be implemented as multiple processing units, each potentially operating independently. ADC 870 may correspond to ADC 100 implemented according to various aspects of the present invention described in sections above.

5. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of generating a first sub-code in a first stage and a second sub-code in a second stage, said first stage and said second stage being contained in a plurality of stages of an analog to digital converter (ADC), an output of said first stage being provided as an input of said second stage, said method comprising:
    sampling an input signal on said first stage using a first sampling capacitor;
    amplifying said input signal sampled by said first sampling capacitor using a first feedback capacitor across an amplifier; and
    flipping said first feedback capacitor as a second sampling capacitor to said second stage,
    wherein noise is reduced due to the use of said first feedback capacitor as said second sampling capacitor to said second stage.

2. The method of claim 1, further comprising:
    subtracting a reference signal from said input signal depending on a value of said first sub-code, wherein said amplifying amplifies a difference of said input signal and said reference signal.

3. The method of claim 2, wherein both of said first stage and said second stage are implemented using said amplifier.

4. A switched capacitor amplifier to amplify an input signal, said switched capacitor amplifier comprising:
    a first sampling capacitor sampling said input signal;
    an amplifier in combination with a feedback capacitor to amplify a signal present on said first sampling capacitor, said feedback capacitor being connected across said amplifier,
    said first sampling capacitor, said amplifier and said feedback capacitor together supporting the operation of a first stage,
    said feedback capacitor being flipped to operate as a sampling capacitor for a second stage which amplifies an output of said first stage.

5. The switched capacitor amplifier of claim 4, further comprising:
    a first switch to connect said feedback capacitor across said amplifier in one configuration, said first switch being open in a second configuration; and
    a second switch to connect said feedback capacitor as a sampling capacitor of said second stage in said second configuration, wherein said second switch is open in said first configuration.

6. The switched capacitor amplifier of claim 5, further comprising a third switch also connecting said feedback capacitor across said amplifier in said one configuration, said third switch also being open in said second configuration.

7. The switched capacitor amplifier of claim 5, wherein said first stage and said second stage are comprised in an analog to digital converter (ADC), said switched capacitor amplifier further comprising:
    a fourth switch located between said first sampling capacitor and said input signal; and
    a sixth switch located between a first reference signal and said first sampling capacitor, wherein said sixth switch is closed to perform a subtraction operation depending on a sub-code generated by said first stage.

8. The switched capacitor amplifier of claim 7, wherein said second stage also uses said amplifier to amplify an output of said first stage, said switched capacitor amplifier further comprising:
    a second feedback capacitor;
    a seventh switch and an eighth switch connecting said second feedback capacitor to a common mode reference in said first configuration; and
    a ninth switch causing said second feedback capacitor to be connected across said amplifier in said second configuration.

9. An analog to digital converter (ADC) generating a first sub-code in a first stage and a second sub-code in a second stage, said first stage and said second stage being contained in a plurality of stages of said ADC, an output of said first stage being provided as an input of said second stage, said ADC comprising:
    means for sampling an input signal on said first stage using a first sampling capacitor;
    means for amplifying said input signal sampled by said first sampling capacitor using a first feedback capacitor across an amplifier; and
    means for flipping said first feedback capacitor as a second sampling capacitor to said second stage,
    wherein noise is reduced due to the use of said first feedback capacitor as said second sampling capacitor to said second stage.

10. The ADC of claim 9, further comprising:
    means for subtracting a reference signal from said input signal depending on a value of said first sub-code, wherein said amplifying amplifies a difference of said input signal and said reference signal.

11. The ADC of claim 10, wherein both of said first stage and said second stage are implemented using said amplifier.

12. A device comprising:
    a processor processing a plurality of digital values;
    an amplifier circuit receiving an input signal and generating an amplified signal, each of said plurality of digital values being generated from said amplified signal, said amplifier circuit comprising:
    a first sampling capacitor sampling said input signal;
    an amplifier in combination with a feedback capacitor to amplify a signal present on said first sampling capacitor, said feedback capacitor being connected across said amplifier,
    said first sampling capacitor, said amplifier and said feedback capacitor together supporting the operation of a first stage,
    said feedback capacitor being flipped to operate as a sampling capacitor for a second stage which amplifies an output of said first stage.

13. The device of claim 12, wherein said amplifier circuit is comprised in an ADC such that said input signal comprises an analog signal, and said ADC generating said plurality of digital values.

14. The device of claim 13 further comprising:

a first switch to connect said feedback capacitor across said amplifier in one configuration, said first switch being open in a second configuration; and a second switch to connect said feedback capacitor as a sampling capacitor of said second stage in said second configuration, wherein said second switch is open in said first configuration.

15. The device of claim 14, further comprising a third switch also connecting said feedback capacitor across said amplifier in said one configuration, said third switch also being open in said second configuration.

16. The device of claim 14, wherein said first stage and said second stage are comprised in an analog to digital converter (ADC), said switched capacitor amplifier further comprising:

a fourth switch located between said first sampling capacitor and said input signal; and a sixth switch located between a first reference signal and said first sampling capacitor, wherein said sixth switch is closed to perform a subtraction operation depending on a sub-code generated by said first stage.

17. The device of claim 16, wherein said second stage also uses said amplifier to amplify an output of said first stage, said switched capacitor amplifier further comprising:

a second feedback capacitor;

a seventh switch and an eighth switch connecting said second feedback capacitor to a common mode reference in said first configuration; and a ninth switch causing said second feedback capacitor to be connected across said amplifier in said second configuration.

* * * * *